United States Patent
Ganguly

(10) Patent No.: US 11,502,217 B1
(45) Date of Patent: Nov. 15, 2022

(54) METHODS AND APPARATUS FOR REDUCING AS-DEPOSITED AND METASTABLE DEFECTS IN AMORPHOUSILICON

(71) Applicant: Gautam Ganguly, Prescott, AZ (US)

(72) Inventor: Gautam Ganguly, Prescott, AZ (US)

( * ) Notice: Subject to any disclaimer, the term of this patent is extended or adjusted under 35 U.S.C. 154(b) by 71 days.

(21) Appl. No.: 17/328,458

(22) Filed: May 24, 2021

(51) Int. Cl.
| | |
|---|---|
| *H01L 31/18* | (2006.01) |
| *H01L 31/20* | (2006.01) |
| *H01L 21/02* | (2006.01) |
| *H01L 21/687* | (2006.01) |
| *H01J 37/32* | (2006.01) |
| *C23C 16/24* | (2006.01) |
| *C23C 16/46* | (2006.01) |
| *C23C 16/50* | (2006.01) |
| *H01L 37/02* | (2006.01) |
| *H01L 29/786* | (2006.01) |

(Continued)

(52) U.S. Cl.
CPC ............ *H01L 31/202* (2013.01); *C23C 16/24* (2013.01); *C23C 16/463* (2013.01); *C23C 16/50* (2013.01); *H01J 37/32733* (2013.01); *H01L 21/0262* (2013.01); *H01L 21/02532* (2013.01); *H01L 21/02592* (2013.01); *H01L 21/68764* (2013.01); *H01J 2237/002* (2013.01); *H01J 2237/2001* (2013.01); *H01J 2237/327* (2013.01); *H01J 2237/3321* (2013.01); *H01L 27/14676* (2013.01); *H01L 29/78663* (2013.01); *H01L 31/03762* (2013.01); *H01L 31/0445* (2014.12); *H01L 31/075* (2013.01); *H01L 31/076* (2013.01); *H01L 37/025* (2013.01)

(58) Field of Classification Search
CPC .. H01L 31/18; H01L 31/1804; H01L 31/1812
See application file for complete search history.

(56) References Cited

U.S. PATENT DOCUMENTS

| | | |
|---|---|---|
| 4,064,521 A | 12/1977 | Carlson |
| 5,288,649 A | 2/1994 | Keenan |
| | (Continued) | |

FOREIGN PATENT DOCUMENTS

| | | |
|---|---|---|
| JP | 4869504 B2 | 2/2012 |
| WO | 2021061461 A1 | 4/2021 |

OTHER PUBLICATIONS

PCT International Search Report dated Jul. 18, 2022 in corresponding International Appl. No. PCT/US2022/026106.

(Continued)

*Primary Examiner* — Jae Lee
(74) *Attorney, Agent, or Firm* — Ostrager Chong Flaherty & Broitman P.C.

(57) ABSTRACT

A method and apparatus for reducing as-deposited and metastable defects relative to amorphous silicon (a-Si) thin films, its alloys and devices fabricated therefrom that include heating an earth shield positioned around a cathode in a parallel plate plasma chemical vapor deposition chamber to control a temperature of a showerhead in the deposition chamber in the range of 350° C. to 600° C. An anode in the deposition chamber is cooled to maintain a temperature in the range of 50° C. to 450° C. at the substrate that is positioned at the anode. In the apparatus, a heater is embedded within the earth shield and a cooling system is embedded within the anode.

18 Claims, 5 Drawing Sheets

(51) Int. Cl.
H01L 31/0376 (2006.01)
H01L 31/0445 (2014.01)
H01L 31/075 (2012.01)
H01L 31/076 (2012.01)
H01L 27/146 (2006.01)

(56) References Cited

U.S. PATENT DOCUMENTS

| | | | |
|---|---|---|---|
| 5,359,186 A | 10/1994 | Fonash | |
| 5,923,050 A | 7/1999 | Jang | |
| 5,942,049 A | 8/1999 | Li et al. | |
| 2012/0097330 A1 | 4/2012 | Iyengar et al. | |
| 2012/0115314 A1* | 5/2012 | Sakamoto | C23C 16/5096 438/479 |
| 2012/0220109 A1* | 8/2012 | Komori | H01J 37/32568 118/723 E |
| 2014/0191618 A1* | 7/2014 | Kijima | H01L 21/324 29/25.35 |
| 2014/0231389 A1* | 8/2014 | Nagami | H01J 37/32706 156/345.28 |
| 2014/0349140 A1* | 11/2014 | Hayakawa | G11B 5/7257 427/127 |
| 2016/0013477 A1* | 1/2016 | Egerton | C25D 9/04 429/231.95 |
| 2016/0135274 A1* | 5/2016 | Fischer | H01J 37/32082 250/492.2 |

OTHER PUBLICATIONS

PCT Written Opinion of the International Searching Authority dated Jul. 18, 2022 in corresponding International Appl. No. PCT/US2022/026106.

Chittick R. et al., "The Preparation and Properties of Amorphous Silicon", 1969 J. Electrochemical Soc. 116, 77-81, The Electrochemical Society.

Staebler, D. L. et al.; "Reversible conductivity changes in discharge-produced amorphous Si", Applied Physics Letters. 31 (4) p. 292 (1977), American Institute of Physics.

Takagi, T., "Gas-phase diagnosis and high-rate growth of stable a-Si:H", Thin Solid Films, vol. 345, pp. 75-79 (1999), Elsevier Science S.A.

Jasinski, Joseph M. et al., "Absolute rate constants for the reaction of silylene with hydrogen, silane, and disilane", J. Chem. Phys. 88, 1678 (1988), American Institute of Physics.

Ganguly et. al., "Optimization of stabilized performance of amorphous silicon solar cells deposited at high growth rates by de coupling of gas and superstrate temperatures", Applied Surface Science 221 (2004) pp. 13-16, Elsevier B.V.

Ganguly, G. et al., "Defect formation during growth of hydrogenated amorphous silicon", Physical Review B, vol. 47, No. 7, 3661-3670 (1993), The American Physical Society.

Matsuda, A. et al., "Independent control of spin density and hydrogen-bonding configuration in glow discharge-hydrogenated Si—Ge alloys using cathode-heating method", Appl. Phys. Lett. 53, 1489 (1988), American Institute of Physics.

Isabella, O., et al., "Thin-film silicon-based quadruple junction solar cells approaching 20% conversion efficiency", Solar Energy Materials & Solar Cells, 129, pp. 82-89 (2014), Elsevier B.V.

Yan, B, "Innovative dual function nc-SiOx:H layer leading to a >16% efficient multi-junction thin-film silicon solar cell", Appl. Phys. Lett. 99, 113512 (2011), American Institute of Phyiscs.

Matsuda, A., "Amorphous and Microcrystalline Silicon", Kasap, S. et al. (Eds ), Springer Handbook of Electronic and Photonic Materials, pp. 573-587, Springer International Publishing AG 2017.

Deng, X. et al., "Amorphous Silicon-Based Solar Cells", Handbook of Photovoltaic Science and Engineering, 1st Edition, Luque, A. et al. (Eds), Chapter 12, pp. 505-565, John Wiley & Sons, Ltd. (2003).

* cited by examiner

FIG 3. a-Si

FIG 4 a-Si/aSiGe

METHODS AND APPARATUS FOR REDUCING AS-DEPOSITED AND METASTABLE DEFECTS IN AMORPHOUSILICON

FIELD OF DISCLOSURE

This disclosure relates generally to amorphous silicon thin films and, more particularly, to methods and an apparatus for reducing both as-deposited and metastable defects relative to amorphous silicon (a-Si) thin films, its alloys and devices fabricated therefrom.

BACKGROUND

Conventional amorphous silicon (a-Si) thin films are used in devices like solar cells, thin film transistors, particle detectors, and other devices, and suffer from formation of metastable defects when subjected to light, electric fields, or temperature change induced stresses. These defects are metastable in the sense they can be annealed away at elevated temperatures. However, these types of devices do not operate at such elevated temperatures and therefore the metastable defects remain and reduce the operating performance of these devices. For example, thin film solar cells under light illumination generate metastable defects and lose power conversion efficiency; thin film transistors under gate voltage stress generate metastable defects and exhibit threshold voltage shifts. In addition, the temperature at which a-Si thin films must be deposited to obtain low as-deposited defect density is about 200° C. Lower deposition temperatures lead to an increase in as-deposited defect density, and this reduces performance of devices. However, lower deposition temperatures, down to below 100° C., are desirable to obtain for example, wide band gap amorphous silicon for high open circuit voltage solar cells or to deposit thin film transistors on flexible plastic substrates.

BRIEF DESCRIPTION

A method and apparatus are disclosed herein for reducing both as-deposited and metastable defects relative to amorphous silicon (a-Si) thin films, its alloys and devices fabricated therefrom during formation of the a-Si thin films in a parallel plate plasma enhanced chemical vapor deposition (PECVD) chamber. In the disclosed method and apparatus, the temperatures of both a showerhead that distributes gas from a cathode to a space between the cathode and an anode (i.e., the parallel plates of the PECVD chamber) and a substrate positioned on the anode are controlled. It has been found that both as-deposited and metastable defects can be reduced by, counterintuitively, heating the showerhead and cooling the anode during the deposition process of depositing an a-Si thin film on a substrate positioned at the anode.

The thin film deposited on the substrate can include any of amorphous silicon (a-Si), an alloy of silicon with germanium (a-SiGe), an alloy of silicon with carbon (a-SiC), an alloy of silicon with oxygen (a-SiO), an alloy of silicon with tin (a-SiSn), an alloy of silicon with lead (a-SiPb), an alloy of silicon with sulphur (a-SiS), and an alloy of silicon with selenium (a-SiSe), amorphous silicon with trace amounts of boron (a-Si:B), amorphous silicon with trace amounts of phosphorus (a-Si:P), and amorphous silicon with trace amounts of aluminum (a-Si:Al). When the thin film is an amorphous silicon (a-Si) film, it is prepared in the PECVD chamber under a dilution of gases selected from hydrogen, deuterium, nitrogen, fluorine, chlorine, helium, neon, argon, and xenon that is distributed by the showerhead to a space between the cathode and anode.

In one aspect of the disclosure, a method is provided for depositing a thin film, such as an amorphous silicon (a-Si) thin film, on a substrate in a parallel plate PECVD chamber. In the method, an earth shield positioned around the cathode in the deposition chamber is heated to control a temperature of the showerhead in the deposition chamber in the range of 350° C. to 600° C. An anode in the deposition chamber is cooled to maintain a temperature in the range of 50° C. to 450° C. at the substrate that is positioned at the anode. The method may also include moving the substrate while depositing the thin film onto the substrate. Electrical power is supplied to the cathode with a first frequency and to the anode with a second frequency that is different from the first frequency. The supplied electrical power may be continuous or pulsed direct current (DC), alternating current (AC) of radio frequency (RF), very high frequency (VHF), microwave frequency (muW) or other such frequencies from 1 kHz to 1 THz.

In another aspect of the disclosure, an apparatus is provided in the form an improved parallel pate PECVD chamber having an earth shield that is positioned around a cathode in the PECVD chamber to control a temperature of a showerhead in the deposition chamber in the range of 350° C. to 600° C. An anode in the deposition chamber is cooled to maintain a temperature in the range of 50° C. to 450° C. at the substrate that is positioned at the anode. A heater is embedded within the earth shield and a cooling system is embedded within the anode. Electrical power supplies are provided to supply the cathode with electrical power having a first frequency and the anode with electrical power having a second frequency that is different from the first frequency.

When deposited on the substrate in accordance with the disclosed method and apparatus, the thin film may form part of and improve performance of an amorphous silicon based device whose performance is reduced by metastable defects such as a single junction amorphous silicon based solar cell with the structure p-i-n or n-i-p, an amorphous silicon based solar cell with a two junction p1-i1-n1-p2-i2-n2 or n1-i1-p1-n2-i2-p2 structure, an amorphous silicon based solar cell with an N-junction structure p1-i1-n1-p2-i2-n2- . . . pN-1N-nN or n1-i1-p1-n2-i2-p2- . . . nN-iN-pN where the i1, i2, . . . iN, an amorphous silicon based thin film transistor, or an amorphous silicon based particle detector, an amorphous silicon x-ray detector, or an amorphous silicon micro bolometer.

The foregoing features, functions, and advantages of the disclosed method and apparatus, as well as other objects, features, functions, and advantages of the disclosed method and apparatus can be achieved independently in various examples of the disclosure or may be combined in yet other examples further details of which can be seen with reference to the following detailed description and drawings.

BRIEF DESCRIPTION OF DRAWINGS

Various implementations of the disclosure will be hereinafter described with reference to following drawings for the purpose of illustrating the disclosed apparatus and method. None of the drawings briefly described in this section are drawn to scale.

Figure 1:
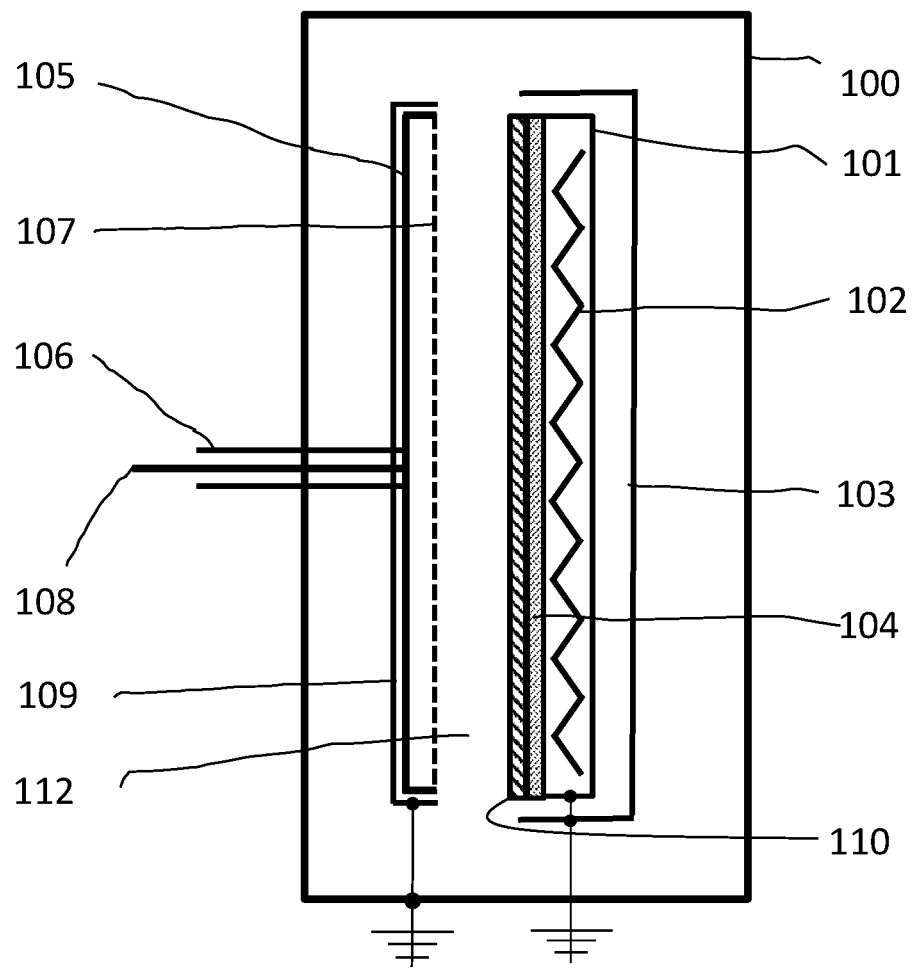
FIG. 1 is an illustration of a prior art parallel plate plasma enhanced chemical vapor deposition (PECVD) chamber.

Reference will hereinafter be made to the drawings in which similar elements in different drawings bear the same reference numerals. Where reference is made in any one or more of the accompanying drawings to steps and/or features, which have the same reference numerals, those steps and/or features have, for the purposes of this description, the same function(s) or operator(s), unless the contrary intention is apparent.

DETAILED DESCRIPTION

Illustrative implementations of an apparatus and methods for reducing as-deposited and metastable defects relative to amorphous silicon (a-Si) thin films, its alloys and devices fabricated therefrom are described in some detail below. A person skilled in the art will appreciate that in the development of an actual implementation of the disclosed apparatus and methods, numerous implementation-specific decisions could be made to achieve a developer's specific goals, such as compliance with system-related and business-related constraints, which will vary from one implementation to another. It will be appreciated that such a development effort might be complex and time-consuming but would nevertheless be a routine undertaking for those of ordinary skill in the art having the benefit of this disclosure. Moreover, the disclosed apparatus and methods can be used or readily adapted for other application-specific uses.

A conventional plasma enhanced chemical vapor deposition (PECVD) chamber that is used to deposit amorphous silicon (a-Si) thin films and devices is illustrated in FIG. 1. It shows a parallel plate plasma chemical vapor deposition chamber (100) with an anode (101) fitted with an embedded heater (102), a heat shield (103) that reduces heat transfer to the walls of the chamber (100), and a substrate (104) on which a useful film (110), such as a-Si thin film, is deposited, in thermal and electrical contact with the anode (101). Facing the substrate (104) is a cathode (105) to which gas is supplied through a gas inlet tube (106) and distributed to the space (112) between the cathode (105) and anode (101) through a showerhead (107). Electrical power, to generate a plasma between the cathode (105) and the anode (101), is fed to the cathode (105) through an electrical line (108) while an earth shield (109) placed close to the cathode (105) prevents a plasma from forming between the cathode (105) and the walls of the chamber (100). The earth shield (109), heat shield (103), and the anode (101) are grounded while the cathode (105) is electrically isolated (floating).

In use, a-Si thin films and devices are deposited on the substrate (104) through an electrical discharge (DC or RF) between the electrically isolated (floating) cathode (105) and the electrically grounded anode (101). The reactant gases (typically a 1 to 5-20 mixture of silane to hydrogen) are supplied through the gas inlet tube (106), through the cathode (105), and then evacuated through one or multiple orifice(s) at the chamber wall (not shown) to maintain a suitable pressure (0.2-5 Torr). The spacing between the substrate (104) and the showerhead (107) is typically set at 10-50 mm. The substrate temperature is maintained at 180° C.-220° C., controlled by the heater (102) embedded in the anode (101). The gas flow rate and electrical power are set so that a film deposition rate of 0.1 nm/s is obtained on the substrate (104) and the gas is not depleted (which means no increase of deposition rate occurs when the total gas flow is increased while keeping the electrical power and the silane to hydrogen flow ratio unchanged). The a-Si thin film (110) deposited on the substrate (104) in accord with conventional methods and apparatus as shown in FIG. 1 typically has a defect density of $2\times10^{15}/cm^3$ to $5\times10^{15}/cm^3$ and when exposed to light under standard conditions (100 mW/cm$^2$ at 50° C. for 600 h), the metastable defect density reached $2\times10^{16}/cm^3$ to $5\times10^{16}/cm^3$.

Figure 2:
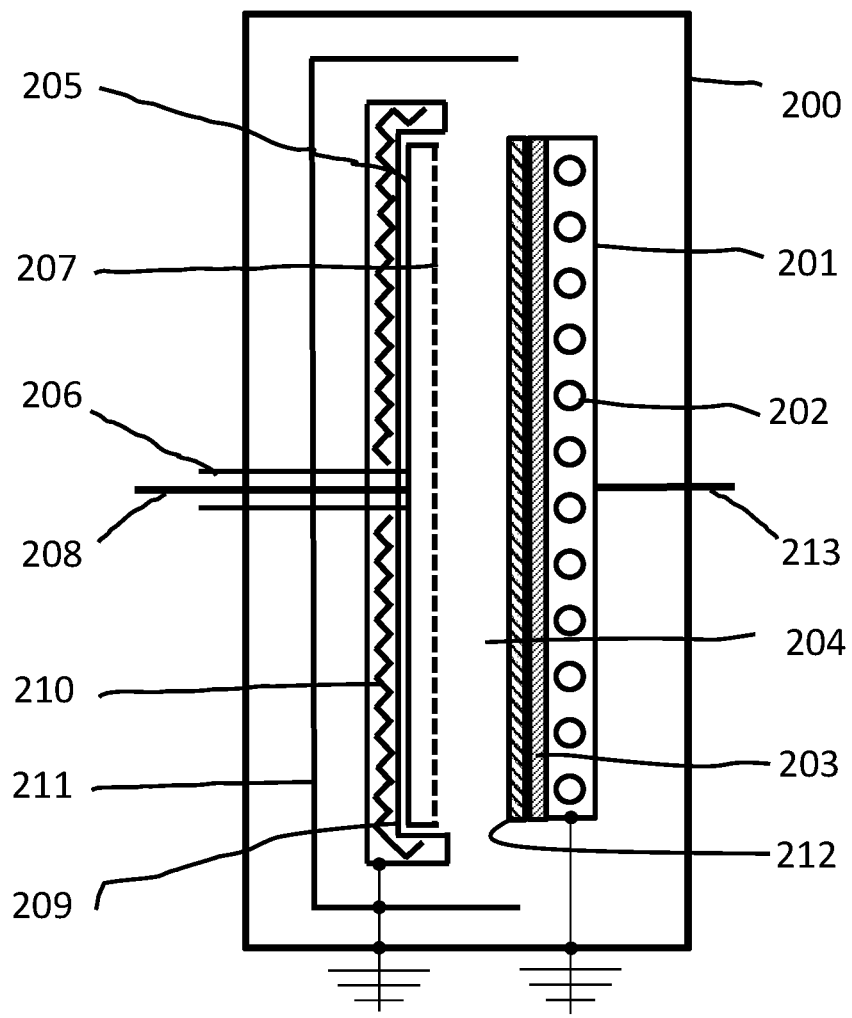
FIG. 2 is an illustration of a parallel plate plasma enhanced chemical vapor deposition chamber in accordance with this disclosure.

An apparatus that can be used to implement the improved method of this disclosure to reduce the defect density of a-Si thin films is illustrated in FIG. 2. In this exemplary implementation, a parallel plate plasma enhanced chemical vapor deposition (200) includes an anode (201) which incorporates a cooling system (202). The cooling of the anode (201) can be carried out using for example a flow of silicone oil that is circulated using a pump through tubes embedded in the anode (201) with an external tank where the oil is cooled. Both the pumping rate and cooling rate can be used to control the temperature of the anode (201) and hence a substrate (203) that is positioned at the anode (201) in thermal and electrical contact with the anode (201). A cathode (205) is positioned to face the anode (201) so the anode (201) and cathode (205) are substantially parallel to each other with a space between the anode (201) and the cathode (205) in a range of 5 mm to 100 mm, and preferably in the range of 10 mm to 20 mm. The anode (201) and the cathode (205) may also be positioned at an angle of 3-7 degrees relative to vertical. FIG. 2 shows the anode (201) and cathode (205) positioned in a vertical direction, but they may also be positioned in a horizontal direction with the cathode (205) below the anode (201). Either one or both of the anode (201) and cathode (205) may be formed as movable sheets wound on rolls such that they can be moved either continuously or in steps during the deposition process. Similarly, the substrate (203) on the anode is discrete, such as one or more pieces of glass, and may be moved continuously when the deposition occurs in multiple chambers and the substrate (203) moves from chamber (200) to successive chamber (200) or intermittently when the deposition occurs with the substrate (203) in one chamber and the plasma is interrupted while the substrate (203) moves to the next chamber (200) to continue the deposition process.

The cathode (205) is connected to a gas supply (206) that distributes gas through a showerhead (207) associated with the cathode (205) into the space (204) between the showerhead (207) and the substrate (203). Electrical power is supplied to the cathode (205) through a power supply (208) to create a discharge between the cathode (205) and the anode (201) while an earth shield (209) placed close to and positioned around the cathode (205) prevents a plasma from forming between the cathode (205) and the walls of the plasma chamber (200). The earth shield (209) is fitted with an embedded heater (210) within the earth shield. A radiation shield (211) is positioned between the earth shield (209) and the chamber (200) wall to reduce the heating up of the chamber walls. The radiation shield (211) extends beyond the cathode (205) towards the anode (201) to confine the plasma and reduce deposition on the chamber walls from the plasma created in the space (204) between the cathode (205) and the anode (201). The earth-shield (209) and radiation shield (211) are grounded while the cathode (205) is electrically isolated (floating). The anode (201) is either grounded or electrically isolated (floating) if a second source of electrical power (213) is connected to it to control its electrical potential that controls the energy of ions impinging on the film (212) during deposition. In other aspects of this disclosure, the cathode (205) as depicted in FIG. 2 can also comprise a set of linear elements such as hollow tubes that have orifices to function as a shower head (207), arranged in a plane parallel to the anode (201). Thus, the cathode (205) and the showerhead (207) can be configured as separate parts or combined into one part. Alternatively, the cathode (205) could be comprised of a mesh that can have periodic or aperiodic spacing between the mesh elements with the mesh aligned in a plane parallel to the anode (201).

The plasma chamber (200) shown in FIG. 2 can be used to make a-Si thin films (212) by controlling a temperature of the showerhead (207) in a range of 350° C. to 600° C. by maintaining the temperature of the heater (210) in the earth shield (209) in a range of 350° C. to 600° C. and by controlling the substrate (203) temperature in the range of 50° C. to 450° C., preferably 100° C. to 200° C., or 180° C. to 220° C. or 350° C. to 450° C. by adjusting the cooling rate of the anode (201) using the cooling system (202) associated with the anode (201). All other parameters—electrical power, gas composition and flow rate, chamber pressure, spacing between showerhead (207) and substrate (203)—are maintained as described above for FIG. 1.

Using the plasma chamber (200) to heat the cathode (205) and cool the anode (201) reduces the density of metastable defect formation sites in the deposited a-Si thin film (212) so that after light illumination under standard conditions, the metastable defect density does not exceed the as-deposited defect density of $2 \times 10^{15}/cm^3$ to $5 \times 10^{15}/cm^3$. The reduction in the metastable defect density can be understood to be due to a reduction in the density of higher silane molecules which have been identified as the source of radicals that generate metastable defect formation sites in the a-Si thin film (212) during growth. The rate of higher silane formation reactions, which are exothermic (emits heat that must be deposited on a surface or carried off as kinetic energy by a third molecule) and hence suppressed when the temperature at the earth shield (209) and showerhead (207) is increased to the 350° C. to 600° C. range. In the best case the metastable defect density is less than the as-deposited (initial) defect density and no change is observed.

The thin film (212) deposited on the substrate (203) in accordance with this disclosure may be amorphous silicon (a-Si) as previously described, or it may be an alloy of silicon with germanium (a-SiGe), an alloy of silicon with carbon (a-SiC), an alloy of silicon with oxygen (a-SiO), an alloy of silicon with tin (a-SiSn), an alloy of silicon with lead (a-SiPb), an alloy of silicon with sulphur (a-SiS), and an alloy of silicon with selenium (a-SiSe), amorphous silicon with trace amounts of boron (a-Si:B), amorphous silicon with trace amounts of phosphorus (a-Si:P), and amorphous silicon with trace amounts of aluminum (a-Si:Al).

The disclosed methods and apparatus can be applied to alloys of silicon with germanium (a-SiGe) to reduce the optical band gap and therefore increase the light absorption to lower photon energies. Similarly, the disclosed methods and apparatus are also applicable to alloys of silicon with carbon (a-SiC) or oxygen (a-SiO) or another element which increases the optical energy gap of a-Si to decrease the light absorption and increase the open circuit voltage of solar cells made using these alloys. The disclosed methods and apparatus are also applicable to a-Si prepared using different dilution gases for silane in lieu of or in addition to hydrogen like deuterium, nitrogen, fluorine, chlorine, helium, neon, argon, and xenon.

In addition, it is possible to realize all the benefits described above when using a mesh type third electrode placed between the anode (201) and the cathode (205) such that gas can flow through the third electrode. The third electrode can be biased negative with respect to the anode (201), which allows confinement of the plasma away from the anode (201) and reduced the ions that arrive at the film (212) during deposition.

Alternatively, the anode (201) can be attached to a second electrical power supply (213) of a frequency different from that connected to the cathode (205), which allows the anode (201) to develop a negative potential, of magnitude varying with the applied power, thus allowing control of the kinetic energy of the positive ions towards the film (212) during deposition. Thus, in some implementations, a first electrical power supply (208) is attached to the cathode (205) and supplies electrical power having a first frequency, and a second electrical power supply (213) is attached to the anode (201) and supplies electrical power having a second frequency different from the first frequency so that the two power sources do not interfere with each other inside the deposition chamber. The supplied electrical power may be continuous or pulsed direct current (DC), alternating current (AC) of radio frequency (RF), very high frequency (VHF), microwave frequency (muW) or other such frequencies from 1 kHz to 1 THz.

Figure 3:
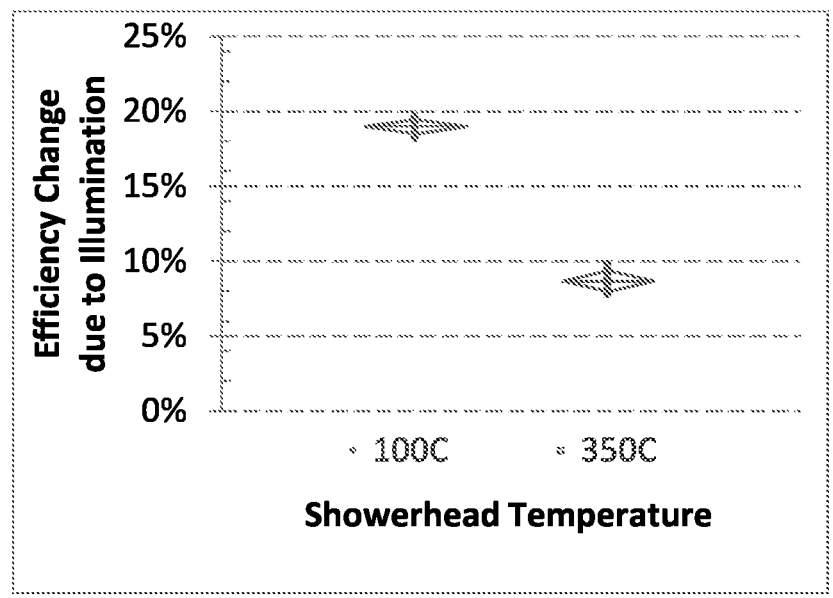
FIG. 3 is a chart showing the change in efficiency of a-Si thin film solar cells deposited in a conventional PECVD chamber as depicted in FIG. 1 as compared to a-Si thin film solar cells deposited using the using the methods of this disclosure and the chamber depicted in FIG. 2.

When using the disclosed method and apparatus to make intrinsic a-Si layers of solar cells, the power conversion efficiency of the solar cell does not decrease significantly when exposed to illumination under standard conditions (resembling conditions experienced in the field). FIG. 3 illustrates the change in power conversion efficiency of a-Si solar cells prepared using the conventional method illustrated in FIG. 1 as well as those prepared using the improved method and apparatus illustrated in FIG. 2. All deposition conditions are the same except the temperature of the showerhead (107 in FIG. 1; 207 in FIG. 2), which is at a temperature of 100° C. when using the conventional heating method of heating the anode (101) to maintain the temperature of the substrate illustrated in FIG. 1 and at a temperature of 350° C. when using the improved method where the earth shield (209) around the cathode (205) is heated as disclosed herein and depicted in FIG. 2. FIG. 3 shows that the disclosed method results in a lower change in power conversion efficiency, thus improving performance of the device that uses the a-Si thin film. The change in the power conversion efficiency of the solar cells after light exposure using standard conditions, relative to the initial as-deposited efficiency, is reduced from about 20% for the conventional deposition method, to about 10% for the improved method, while the initial (before light exposure) efficiency is the same.

Figure 4:
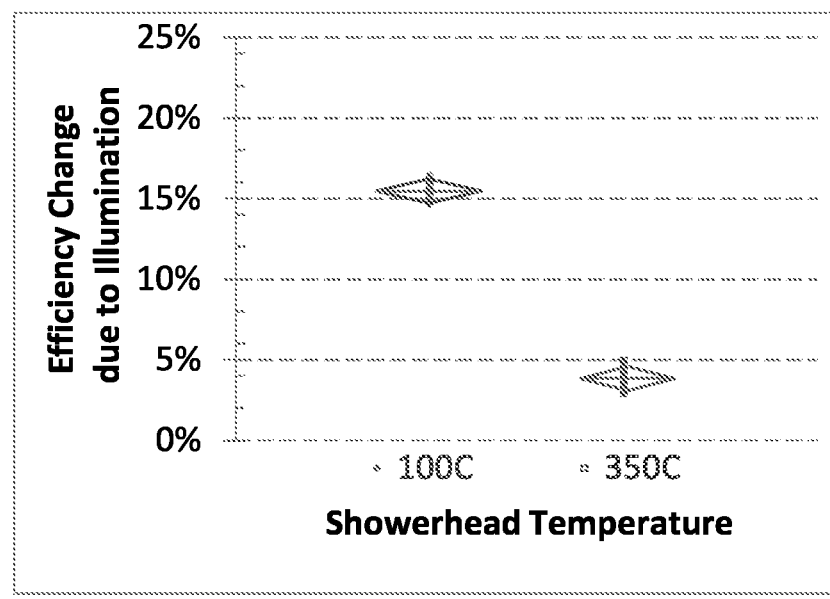
FIG. 4 is a chart showing the change in efficiency of a-Si/a-SiGe two junction thin film solar cells deposited in a conventional PECVD chamber as depicted in FIG. 1 as compared to a-Si thin film solar cells deposited using the methods of this disclosure and the chamber depicted in FIG. 2.

In FIG. 4, the change in power conversion efficiency of amorphous silicon/amorphous silicon germanium (a-Si/a-SiGe) two junction thin film solar cells prepared using the conventional method of FIG. 1 is compared to that when such solar cells were made using the improved method and apparatus of FIG. 2.

All deposition conditions are the same except the temperature of the showerhead which is at a temperature of 100° C. when using the conventional anode heating method of FIG. 1 and at a temperature of 350° C. when using the improved method and apparatus disclosed herein, where the earth shield (209) around the cathode (205) is heated as disclosed herein and depicted in FIG. 2. FIG. 4 shows that the disclosed method results in a lower change in power conversion efficiency, thus improving performance of the device that uses the a-Si/a-SiGe two junction thin film. The change in the power conversion efficiency of the solar cells due to light exposure using standard conditions (that mimic actual conditions in the field) is reduced from about 15% for conventional deposition method to about 5% for the improved method of the invention, while the initial (before light exposure) efficiency is the same.

This illustrates the effectiveness of the improved method and apparatus in reduction of the creation of metastable defects in both a-Si and a-Si/a-SiGe thin films, which cause reduction of the power conversion efficiency of thin film solar cells. Increasing the temperature at the earth shield (209) as described above, with the introduction of a cooling system (202) at the anode (201), further reduces the change in power conversion efficiency of a-Si based solar cells.

The disclosed method and apparatus, when used to make a-Si thin film transistors, can also be expected to have reduced susceptibility to threshold voltage shift. Similar implications are warranted for other devices made using amorphous silicon layers prepared as disclosed herein. The reason for the improvement in the performance of the solar cells and other devices is suggested to be that the chemistry by which higher silane molecules are formed in the plasma that create sites for metastable defect formation in the deposited amorphous silicon thin films is altered by the high temperature at the earth-shield (209), showerhead (207), and cathode (205) surfaces that are in contact with the plasma. The source of the metastable defect formation sites is believed to be higher silanes that are expected to form through exothermic reactions that occur close to or on the surface of the showerhead (207) on the cathode (205) as well as the earth-shield (209) close to the showerhead (207). The net rates of exothermic reactions that form higher silane molecules, which are three-body reactions, are reduced as the reaction zone becomes hotter which increases the rate of the reverse reaction—that is decomposition of the higher silane molecules. The concentration of higher silane molecules becomes relatively high when the temperature of the substrate (104) is reduced below 200° C. using the conventional method and apparatus of FIG. 1 as the temperature of the cathode (105) and earth shield (109) drop close to 50° C. This results in an increase of the as-deposited defect density in the a-Si thin films. However, when using the improved method and apparatus of FIG. 2, the high temperature of the cathode (205) and earth shield (209) ensure that the concentration of higher silane molecules remains low even when the temperature of the substrate (203) is reduced below 200° C.

The plasma chamber (200) and its components as illustrated in FIG. 2 can be used to further optimize the conditions for deposition of a-Si thin films beyond the conditions described above while keeping within the spirit of this improved method of the invention. This could further suppress the observed changes under standard light exposure in the metastable defect density in the deposited amorphous silicon films. Consequently, performance changes in solar cells and thin film transistors and other devices will also exhibit reduced changes with light, electric field or temperature change induced stress. The guiding rule of the method is that the higher the temperature of the earth-shield (209), showerhead (207), and cathode (205) for the same substrate (203) temperature, the greater the reduction in metastable defects in the a-Si thin films. This would allow skilled practitioners of the art to increase the as-deposited efficiency of multiple junction a-Si based solar cells from 15% reported so far, to more than 20% as predicted by theoretical modelling.

Figure 5:
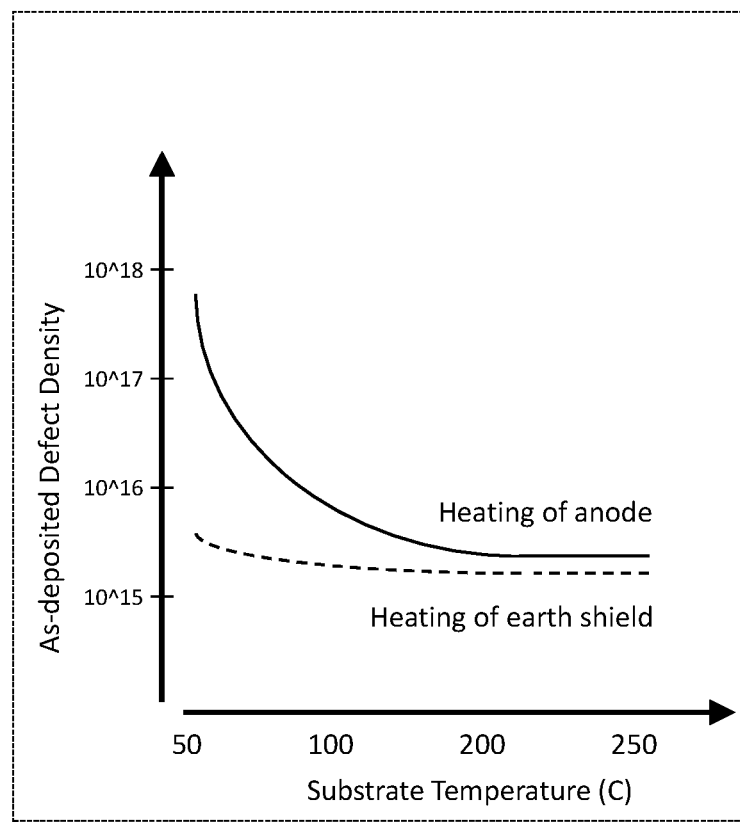
FIG. 5 is a chart illustrating schematically the as-deposited defect density in a-Si thin films deposited at substrate temperatures from 50-250° C. in a conventional PECVD chamber as depicted in FIG. 1 as compared to the as-deposited defect density in a-Si thin films when prepared at the same substrate temperatures using the methods of this disclosure and the chamber depicted in FIG. 2.

In other aspects of this disclosure, using the plasma chamber (200) of FIG. 2, the earth-shield heater (210) is set at the highest value possible in the range 350° C. to 600° C. and the anode cooling system (202) is adjusted to control the substrate (203) temperature in the range of 50° C. to 250° C. This will yield a range of a-Si thin films with the hydrogen content and optical band gap decreasing as the temperature increases from 50° C. to 250° C. The defect density of the as-deposited a-Si thin films will be lower than is currently possible with existing PECVD chambers. This is illustrated schematically in FIG. 5 where the currently obtainable as-deposited defect density in a-Si thin films using the conventional PECVD chamber of FIG. 1 (heating of anode) is significantly higher than that obtainable with the improved method and apparatus of FIG. 2 (heating of earth shield (209) and cooling of anode (201)). In view of the results shown in FIG. 3 and FIG. 4, the metastable defect density will be significantly lower for these films prepared using the improved method and apparatus compared to preparation using the conventional method illustrated in FIG. 1 for the same substrate temperatures. This will enable preparation of devices incorporating a-Si thin films with a wider range of optical band gaps that have improved as-deposited performance as well as performance after stress that is known to produce performance loss relative to devices prepared using the method illustrated in FIG. 1.

Thus, using the disclosed methods and apparatus, the thin film (212) can be deposited on the substrate (203) to form part of an amorphous silicon based device whose performance is reduced by metastable defects including a single junction amorphous silicon based solar cell with the structure p-i-n or n-i-p, an amorphous silicon based solar cell with a two junction p1-i1-n1-p2-i2-n2 or n1-i1-p1-n2-i2-p2 structure, an amorphous silicon based solar cell with an N-junction structure p1-i1-n1-p2-i2-n2- . . . pN-1N-nN or n1-i1-p1-n2-i2-p2- . . . nN-iN-pN where the i1, i2, . . . iN, an amorphous silicon based thin film transistor, and an amorphous silicon based particle detector, an amorphous silicon x-ray detector, and an amorphous silicon micro bolometer.

Many modifications of the apparatus and methods disclosed herein may occur to those skilled in the art upon reading the specification. For example, the amorphous silicon thin film can be replaced by alloys with other elements and dilution with other gases that have been used to obtain certain material characteristics for application in specific devices. The improved method and apparatus disclosed herein can also be applied to a variety of deposition conditions that are suitable for each material with the benefits of reduction of as-deposited and metastable defect density with consequent improvement in the performance of those devices. The present disclosure includes such modifications and is limited only by the scope of the claims. The method claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the method claims be construed to exclude any portions of two or more steps being performed concurrently or alternatingly unless the claim language explicitly states a condition that precludes such an interpretation.

I claim:

1. A method for depositing a thin film on a substrate in a parallel plate plasma chemical vapor deposition chamber, the method comprising:
heating an earth shield positioned around a cathode in the deposition chamber to control a temperature of a showerhead in the deposition chamber in the range of 350° C. to 600° C.

2. The method of claim 1, further comprising cooling an anode in the deposition chamber to maintain a temperature in the range of 50° C. to 450° C. at the substrate that is positioned at the anode.

3. The method of claim 1, wherein the thin film deposited on the substrate is selected from the group consisting of amorphous silicon (a-Si), an alloy of silicon with germanium (a-SiGe), an alloy of silicon with carbon (a-SiC), an alloy of silicon with oxygen (a-SiO), an alloy of silicon with tin (a-SiSn), an alloy of silicon with lead (a-SiPb), an alloy of silicon with sulphur (a-SiS), and an alloy of silicon with selenium (a-SiSe).

4. The method of claim 1, wherein the thin film deposited on the substrate is selected from the group consisting of amorphous silicon (a-Si), amorphous silicon with trace amounts of boron (a-Si:B), amorphous silicon with trace amounts of phosphorus (a-Si:P), and amorphous silicon with trace amounts of aluminum (a-Si:Al).

5. The method of claim 1, where the thin film is an amorphous silicon (a-Si) film prepared under a dilution of gases selected from the group consisting of hydrogen, deuterium, nitrogen, fluorine, chlorine, helium, neon, argon, and xenon.

6. The method of claim 2, the method further comprising moving the substrate while depositing the thin film onto the substrate.

7. The method of claim 2, further comprising depositing the thin film on the substrate to form part of an amorphous silicon based device whose performance is reduced by metastable defects selected from the group consisting of a single junction amorphous silicon based solar cell with the structure p-i-n or n-i-p, an amorphous silicon based solar cell with a two junction p1-i1-n1-p2-i2-n2 or n1-i1-p1-n2-i2-p2 structure, an amorphous silicon based solar cell with an N-junction structure p1-i1-n1-p2-i2-n2- . . . pN-1N-nN or n1-i1-p1-n2-i2-p2- . . . nN-iN-pN where the i1, i2, . . . iN, an amorphous silicon based thin film transistor, and an amorphous silicon based particle detector, an amorphous silicon x-ray detector, and an amorphous silicon micro bolometer.

8. The method of claim 2, further comprising supplying electrical power to the cathode, wherein the supplied electrical power is selected from the group consisting of continuous or pulsed direct current (DC), alternating current (AC) of radio frequency (RF), very high frequency (VHF), microwave frequency (muW) or other such frequencies from 1 kHz to 1 THz.

9. The method of claim 8, further comprising supplying electrical power to the anode, wherein the electrical power supplied to the anode has a first frequency, and the electrical power supplied to the cathode has a second frequency different from the first frequency.

10. A plasma chemical vapor deposition chamber comprising:
an earth shield positioned around a cathode in the deposition chamber that controls a temperature of a showerhead in the deposition chamber at 350° C. to 600° C.

11. The deposition chamber of claim 10, further comprising a cooling system associated with an anode in the deposition chamber for maintaining a temperature in the range of 50° C. to 450° C. at a substrate that is positioned at the anode.

12. The deposition chamber of claim 11, further comprising a heater embedded within the earth shield.

13. The deposition chamber of claim 11, further comprising a first electrical power supply attached to the anode, a second electrical power supply attached to the cathode, the first electrical power supply having a first frequency, and the second electrical power supply having a second frequency different from the first frequency.

14. The deposition chamber of claim 11, wherein the anode and the cathode are arranged in a vertical direction with a space therebetween in a range of 5 mm to 100 mm.

15. The deposition chamber of claim 14, wherein the space between the anode and the cathode is in the range of 10 mm to 20 mm.

16. The deposition chamber of claim 14, wherein the anode and the cathode are arranged in the vertical direction substantially parallel to each other or at an angle of 3-7 degrees to vertical.

17. The deposition chamber of claim 11, wherein the anode and the cathode are arranged in a horizontal direction with the cathode below the anode.

18. The deposition chamber of claim 11, wherein one or both of the anode and the cathode are movable sheets.

* * * * *